(12) United States Patent
Bonam et al.

(10) Patent No.: US 10,943,883 B1
(45) Date of Patent: Mar. 9, 2021

(54) PLANAR WAFER LEVEL FAN-OUT OF MULTI-CHIP MODULES HAVING DIFFERENT SIZE CHIPS

(71) Applicant: International Business Machines Corporation, Armonk, NY (US)

(72) Inventors: Ravi K. Bonam, Albany, NY (US); Mukta Ghate Farooq, Hopewell Junction, NY (US); Dinesh Gupta, Hopewell Junction, NY (US); James J. Kelly, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/576,240

(22) Filed: Sep. 19, 2019

(51) Int. Cl.
  *H01L 25/04* (2014.01)
  *H01L 23/00* (2006.01)
  (Continued)

(52) U.S. Cl.
  CPC .............. *H01L 24/24* (2013.01); *H01L 24/25* (2013.01); *H01L 24/73* (2013.01); *H01L 24/82* (2013.01);
  (Continued)

(58) Field of Classification Search
  CPC .......................... H01L 25/0655; H01L 25/042
  See application file for complete search history.

(56) References Cited

U.S. PATENT DOCUMENTS

| 6,440,819 B1 | 8/2002 | Luning |
| 6,627,477 B1 | 9/2003 | Hakey et al. |

(Continued)

FOREIGN PATENT DOCUMENTS

| CN | 106876356 A | 6/2017 |
| CN | 108389823 A | 8/2018 |
| WO | 2017196257 A1 | 11/2017 |

OTHER PUBLICATIONS

D. Yu et al., "Embedded Si Fan Out: A Low Cost Wafer Level Packaging Technology Without Molding and De-bonding Processes," IEEE 67th Electronic Components and Technology Conference (ECTC), May 2017, pp. 28-34.

(Continued)

*Primary Examiner* — Matthew L Reames
(74) *Attorney, Agent, or Firm* — Abdy Raissinia; Ryan, Mason & Lewis, LLP

(57) ABSTRACT

Package structures and methods are provided for constructing multi-chip package structures using semiconductor wafer-level-fan-out techniques in conjunction with back-end-of-line fabrication methods to integrate different size chips (e.g., different thicknesses) into a planar package structure. The packaging techniques take into account intra-chip thickness variations and inter-chip thickness differences, and utilize standard back-end-of-line fabrication methods and materials to account for such thickness variations and differences. In addition, the back-end-of-line techniques allow for the formation of multiple layers of wiring and inter-layer vias which provide high density chip-to-chip interconnect wiring for high-bandwidth I/O communication between the package chips, as well as redistribution layers to route power/ground connections between active-side connections of the semiconductor chips to an area array of solder bump interconnects on a bottom side of the multi-chip package structure.

20 Claims, 7 Drawing Sheets

(51) Int. Cl.
  *H01L 25/00* (2006.01)
  *H01L 25/18* (2006.01)
  *H01L 25/065* (2006.01)

(52) U.S. Cl.
  CPC .......... *H01L 24/97* (2013.01); *H01L 25/042* (2013.01); *H01L 25/0655* (2013.01); *H01L 25/18* (2013.01); *H01L 25/50* (2013.01); *H01L 2224/24011* (2013.01); *H01L 2224/24105* (2013.01); *H01L 2224/24137* (2013.01); *H01L 2224/25171* (2013.01); *H01L 2224/25174* (2013.01); *H01L 2224/73267* (2013.01); *H01L 2224/82007* (2013.01)

(56) References Cited

U.S. PATENT DOCUMENTS

| | | |
|---|---|---|
| 7,005,319 B1 | 2/2006 | Chen et al. |
| 8,598,694 B2 | 12/2013 | Hosseini et al. |
| 9,385,006 B2 | 7/2016 | Lin et al. |
| 9,589,920 B2 | 3/2017 | Hurwitz et al. |
| 10,026,672 B1 | 7/2018 | Herrault et al. |
| 10,242,973 B2 | 3/2019 | Baek et al. |
| 10,325,859 B1 * | 6/2019 | Kim .................. H01L 25/16 |
| 2018/0068978 A1 | 3/2018 | Jeng et al. |

OTHER PUBLICATIONS

L.S.H. Lee et al., "FOWLP Technology as Wafer Level System in Packaging (SiP) Solution," International Conference on Electronics Packaging (ICEP), Apr. 2017, pp. 491-493.

H. Jeong et al., "Thermomechanical Properties of Fan-Out Wafer Level Package with Various Chip and Mold Thickness," IEEE 68th Electronic Components and Technology Conference (ECTC), May 2018, pp. 2121-2126.

T. Braun et al., "Development of a Multi-Project Fan-Out Wafer Level Packaging Platform," IEEE 67th Electronic Components and Technology Conference (ECTC), May 2017, pp. 1-7.

* cited by examiner

10

20

PLANAR WAFER LEVEL FAN-OUT OF MULTI-CHIP MODULES HAVING DIFFERENT SIZE CHIPS

TECHNICAL FIELD

This disclosure generally relates to semiconductor packaging techniques and, in particular, to multi-chip package structures.

BACKGROUND

Innovations in semiconductor fabrication and packaging technologies have enabled the development of smaller scale, higher density integrated circuit (IC) chips (or dies), as well as the development of highly integrated chip modules with wiring and area array input/output (I/O) contact densities that enable dense packaging of IC chips (or dies). For certain applications, high-performance electronic modules are constructed with one or more multi-chip modules (MCMs) mounted to a circuit board (e.g., a system board (or node card), a printed circuit board, a printed wiring board, etc.) using a suitable area array connection technique for module-to-board I/O interconnections (e.g., land grid array (LGA) or ball grid array (BGA) connections). MCM technology can be utilized to form a first level package structure with high-density packaging of multiple IC processor chips for computer server applications, or multiple heterogeneous chips for custom applications, etc.

Various conventional techniques can be utilized to construct an MCM package structure. For example, an MCM can be constructed by connecting multiple semiconductor IC dies directly to a package substrate. The semiconductor IC dies can be connected to a surface of the package substrate using wiring bonding, tape bonding, or flip-chip bonding. For high performance and high-density packages, direct chip attachment (DCA) techniques are commonly used for flip-chip bonding IC dies to the package substrate using area arrays of solder interconnects formed between contact pads on active surfaces of the semiconductor IC dies and matching arrays of contact pads formed on a chip mounting surface (or top-side surface) on the package substrate. The package substrate includes wiring for providing die-to-die connections between IC dies mounted to the top-side of the package substrate, as well as wiring for connecting the top-side contacts pads to bottom-side contact pads.

In conventional MCM technologies, the package substrate can be, e.g., a glass-ceramic substrate, or a laminate substrate. For example, a multi-layer ceramic package substrate can be fabricated using low-temperature co-fired ceramic (LTCC) substrate technology. In addition, a laminate package substrate can be fabricated using surface laminate circuit (SLC) technology to produce low-cost organic package substrates with build-up layers that are vertically connected through micro-vias to support solder-bumped flip-chips.

There is a continued demand for IC chips with increasing integrated functionality and smaller footprint sizes, which leads to increases in the I/O count and I/O density of the IC chips. Moreover, high-performance and high-density integrated package solutions typically require small micro-bumps for flip-chip connectivity using interconnect pitches of, e.g., 50 microns or less, and line width and line spacing design rules of 10 microns or less. While an MCM package structure allows heterogeneous IC dies to be directly connected (e.g., DCA) to each other through the package substrate, conventional ceramic-based package substrate and laminate substrate technologies are limited with regard to the smallest achievable contact pad pitch, line width and line spacing. As such, conventional ceramic and organic laminate build up substrates are a bottleneck to high-density packaging, as such substrate technologies cannot support the tight pitches needed for high-density I/O flip-chip connections and high-density die-to-die interconnections.

SUMMARY

Embodiments of the disclosure include multi-chip package structures and methods for fabricating multi-chip package structures. For example, one embodiment includes a package structure. The package structure comprises a semiconductor substrate carrier comprising a first trench and a second trench disposed in a surface of the semiconductor substrate carrier. A first semiconductor integrated circuit chip is disposed in the first trench and a second integrated circuit chip is disposed in the second trench. The first semiconductor integrated circuit chip comprises a first array of contact pads disposed on an active surface of the first semiconductor integrated circuit chip, wherein the first semiconductor integrated circuit chip is disposed in the first trench with the active surface of the first semiconductor integrated circuit chip facing outward from the first trench. The second semiconductor integrated circuit chip comprises a second array of contact pads disposed on an active surface of the second semiconductor integrated circuit chip, wherein the second semiconductor integrated circuit chip is disposed in the second trench with the active surface of the second semiconductor integrated circuit chip facing outward from the second trench. The active surface of at least one of the first and second semiconductor integrated circuit chips is non-coplanar with the surface of the semiconductor substrate carrier as a result of a difference between a trench depth and a chip thickness. A planarized insulation layer is disposed over the surface of the semiconductor substrate carrier and the active surfaces of the first and second integrated circuit chips. An array of vertical vias are disposed in the planarized insulation layer and in contact with the first and second arrays of contact pads of the first and second integrated circuit chips. A multi-layer interconnect structure is disposed on the planarized insulating layer. The multi-layer interconnect structure comprises wiring to provide chip-to-chip connections between the first and second integrated circuit chips, and wiring to provide package-to-chip connections comprising power connections to the first and second integrated circuit chips.

Another embodiment includes a method for constructing a package structure. The method comprises forming a first trench and a second trench in a surface of a semiconductor substrate carrier, placing a first semiconductor integrated circuit chip into the first trench, and placing a second semiconductor integrated circuit chip into the second trench. The first semiconductor integrated circuit chip comprises a first array of contact pads disposed on an active surface of the first semiconductor integrated circuit chip, wherein the first semiconductor integrated circuit chip is placed in the first trench with the active surface of the first semiconductor integrated circuit chip facing outward from the first trench. The second semiconductor integrated circuit chip comprises a second array of contact pads disposed on an active surface of the second semiconductor integrated circuit chip, wherein the second semiconductor integrated circuit chip is placed in the second trench with the active surface of the second semiconductor integrated circuit chip facing outward from the second trench. The active surface of at least one of the first and semiconductor integrated circuit chips is non-coplanar with the surface of the semiconductor substrate carrier as a result of a difference between a trench depth and a chip thickness. A planarized insulation layer is formed over the surface of the semiconductor substrate carrier and the active surfaces of the first and second integrated circuit chips, and an array of vertical vias is formed in the planarized insulation layer, wherein the vertical vias are formed in contact with the first and second arrays of contact pads of the first and second integrated circuit chips. A multi-layer interconnect structure is formed over the planarized insulating layer, wherein the multi-layer interconnect structure comprises wiring to provide chip-to-chip connections between the first and second integrated circuit chips, and wiring to provide package-to-chip connections which comprise power and ground connections to the first and second integrated circuit chips.

Another embodiment includes a method for constructing a package structure. The method comprises forming a first trench and a second trench in a surface of a silicon wafer, placing a first semiconductor chip into the first trench, and placing a second semiconductor chip into the second trench. The first semiconductor integrated circuit chip comprises a first array of contact pads disposed on an active surface of the first semiconductor integrated circuit chip, wherein the first semiconductor integrated circuit chip is placed in the first trench with the active surface of the first semiconductor integrated circuit chip facing outward from the first trench. The second semiconductor integrated circuit chip comprises a second array of contact pads disposed on an active surface of the second semiconductor integrated circuit chip, wherein the second semiconductor integrated circuit chip is placed in the second trench with the active surface of the second semiconductor integrated circuit chip facing outward from the second trench. The active surface of at least one of the first and semiconductor integrated circuit chips is non-coplanar with the surface of the silicon wafer as a result of a difference between a trench depth and a chip thickness. A planarized insulation layer is formed over the surface of the silicon wafer and the active surfaces of the first and second integrated circuit chips, and array of vertical vias is formed in the planarized insulation layer, wherein the vertical vias are formed in contact with the first and second arrays of contact pads of the first and second integrated circuit chips. A multi-layer interconnect structure is formed over the planarized insulating layer, wherein the multi-layer interconnect structure comprises wiring to provide chip-to-chip connections between the first and second integrated circuit chips, and wiring to provide package-to-chip connections which comprise power and ground connections to the first and second integrated circuit chips. The silicon wafer is diced to obtain at least one multi-chip package structure comprising the first and second integrated circuit chips.

Other embodiments of the disclosure will be described in the following detailed description of embodiments, which is to be read in conjunction with the accompanying figures.

BRIEF DESCRIPTION OF THE DRAWINGS

FIGS. 2-7 schematically illustrate a method for fabricating the multi-chip package structure of FIG. 1 according to an embodiment of the disclosure, wherein:

FIG. 2 is a schematic cross-sectional side view of the multi-chip package structure at an initial stage of fabrication comprising a semiconductor substrate carrier having a plurality of trenches etched in a surface of the semiconductor substrate carrier;

FIG. 3 is a schematic cross-sectional side view of the intermediate multi-chip package structure of FIG. 2 after placing semiconductor integrated circuit chips into the etched trenches of the semiconductor substrate carrier;

FIG. 4 is a schematic cross-sectional side view of the intermediate multi-chip package structure of FIG. 3 after depositing a layer of insulating material over the surface of the semiconductor substrate carrier to cover active surfaces of the semiconductor integrated circuit chips;

FIG. 5 is a schematic cross-sectional side view of the intermediate multi-chip package structure of FIG. 4 after planarizing the layer of insulating material to form a planarized insulating layer with a planarized surface;

FIG. 6 is a schematic cross-sectional side view of the intermediate multi-chip package structure FIG. 5 after patterning the planarized insulating layer to form via openings that expose contact pads on the active surfaces of the semiconductor integrated circuit chips; and FIG. 7 is a schematic cross-sectional side view of the intermediate multi-chip package structure of FIG. 6 after filling the via openings with metallic material to form vertical vias in contact with the exposed contact pads.

FIGS. 9-10 schematically illustrate a method for fabricating the multi-chip package structure of FIG. 8 according to another embodiment of the disclosure, wherein:

FIG. 9 is a schematic cross-sectional side view of the intermediate multi-chip package structure of FIG. 2, after forming thermal interface material layers on bottom surfaces of the trenches etched in the semiconductor substrate carrier; and FIG. 10 is a schematic cross-sectional side view of the intermediate multi-chip package structure of FIG. 9 after placing the semiconductor integrated circuit chips into the etched trenches of the semiconductor substrate carrier and after depositing and planarizing a layer of insulation material to form a planarized insulating layer;

FIGS. 11-12 schematically illustrate a method for fabricating the multi-chip package structure according to another embodiment of the disclosure, wherein:

FIG. 11 is a schematic cross-sectional side view of the intermediate multi-chip package structure of FIG. 2 after forming a conformal bonding layer which lines bottom and sidewall surfaces of the trenches etched in the semiconductor substrate carrier; and FIG. 12 is a schematic cross-sectional side view of the intermediate multi-chip package structure of FIG. 11 after placing the semiconductor integrated circuit chips into the etched trenches of the semiconductor substrate carrier which are lined with the conformal bonding layer.

DETAILED DESCRIPTION

Figure 1:
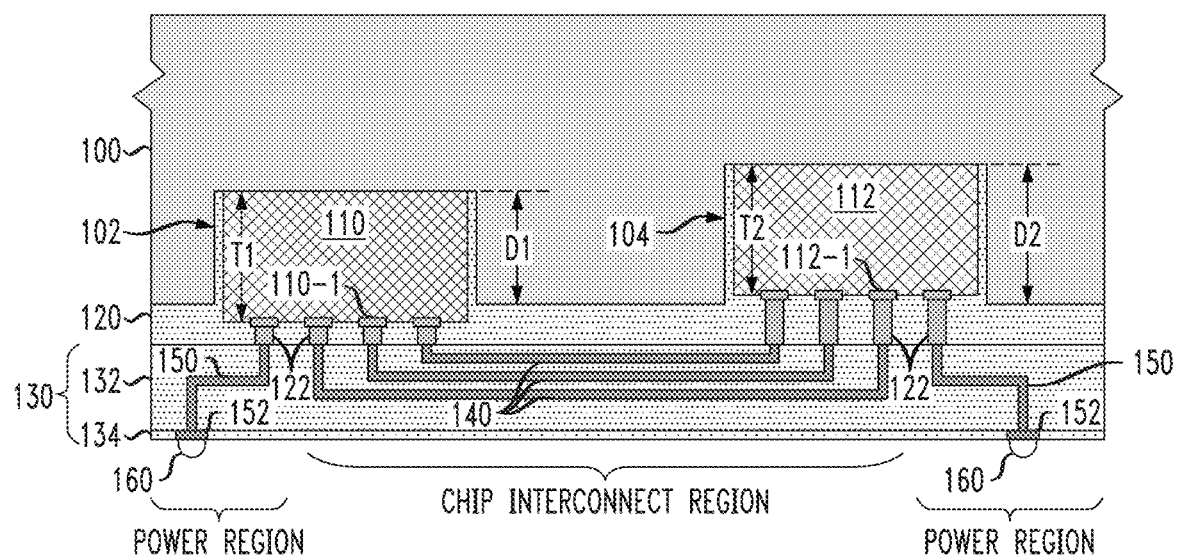
FIG. 1 schematically illustrates a multi-chip package structure according to an embodiment of the disclosure.

Embodiments of the invention will now be discussed in further detail with regard to multi-chip package structures and techniques for packaging multiple semiconductor integrated IC dies (alternatively referred to herein as semiconductor IC chips) from different nodes/technologies and/or different chip suppliers into a planar module. Multi-chip packaging techniques according to embodiments of the disclosure utilize semiconductor wafer-level-fan-out (WLFO) techniques in conjunction with back-end-of-line (BEOL) fabrication methods to integrate different size chips (e.g., different thicknesses) into a planar package structure. The packaging techniques take into account intra-chip thickness variations and inter-chip thickness differences of semiconductor chips that are obtained from the same and/or different chip suppliers, and utilize standard BEOL fabrication methods and materials to account for such thickness variations and differences. In addition, the BEOL techniques allow for the formation of multiple layers of wiring and inter-layer vias which provide high density chip-to-chip interconnect wiring for high-bandwidth I/O communication between the package chips, as well as redistribution layers to route power/ground connections between active-side connections of the semiconductor IC chips to an area array of solder bump interconnects on a bottom side of the multi-chip package structure.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount. The term "exemplary" as used herein means "serving as an example, instance, or illustration". Any embodiment or design described herein as "exemplary" is not to be construed as preferred or advantageous over other embodiments or designs. The word "over" as used herein to describe forming a feature (e.g., a layer) "over" a side or surface, means that the feature (e.g. the layer) may be formed "directly on" (i.e., in direct contact with) the implied side or surface, or that the feature (e.g., the layer) may be formed "indirectly on" the implied side or surface with one or more additional layers disposed between the feature (e.g., the layer) and the implied side or surface.

FIG. 1 schematically illustrates a multi-chip package structure 10 according to an embodiment of the disclosure. The multi-chip package structure 10 comprises a semiconductor substrate carrier 100, a plurality of trenches 102 and 104 etched in a surface of the semiconductor substrate carrier 100, a plurality of semiconductor IC chips 110 and 112 disposed in the trenches 102 and 104, respectively, an insulating layer 120, and a wiring layer 130. As shown in FIG. 1, the semiconductor IC chips 110 and 112 each have an array of contact pads 110-1 and 112-1, respectively, which are exposed on an active side of the semiconductor IC chips 110 and 112. The semiconductor IC chips 110 and 112 are disposed in the trenches 102 and 104 with the active sides of the semiconductor IC chips 110 and 112 facing outward from the trenches 102 and 104. The insulating layer 120 comprises conductive vias 122 that provide vertical connections from the contact pads 110-1 and 112-1 of the semiconductor IC chips 110 and 112 to the wiring layer 130. The wiring layer 130 comprises a multi-level BEOL structure comprising multiple levels of dielectric material 132 (inter-layer dielectric (ILD) layers), a passivation layer 134, die-to-die interconnect wiring 140, fan-out wiring 150 to provide package-to-die connections for power/ground connections to the semiconductor IC chips 110 and 112, and an array of contact pads 152 encapsulated in the passivation layer 134. An array of solder bumps 160 are formed on the array of contact pads 152.

The multi-chip package structure 10 is configured to enable heterogeneous packaging of different chips of varying sizes (e.g., thicknesses) which are fabricated using different nodes/technologies and/or which are obtained from different chip suppliers/manufacturers. The semiconductor IC chips 110 and 112 may comprise any type of integrated circuits and systems to implement a target application. For illustrative purposes, the exemplary package structure 10 of FIG. 1 shows two semiconductor IC chips 110 and 112, although the package structure 10 could have more than two semiconductor IC chips. In accordance with embodiments of the disclosure, the semiconductor IC chips 110 and 112 are assumed to be different chips with different sizes (e.g., different thicknesses and/or footprint areas). For example, the semiconductor IC chips 110 and 112 may comprise one or more of a combination of a memory chips (e.g., high-bandwidth memory (HBM) dynamic random-access memory (DRAM) chip, other memory chips), processors such as hardware accelerator chips, a multi-core processor chip, central processing units, microcontrollers, an application-specific integrated circuit (ASIC), a field programmable gate array (FPGA), and other types of general purposes processors or work-load optimized processors such as graphics processing units (GPUs), digital signal processors (DSPs), system-on-chip (SoC), and other types of specialized processors or coprocessors that are configured to execute one or more fixed functions.

The semiconductor substrate carrier 100 comprises a portion of a semiconductor wafer which is formed of a semiconductor material (e.g., silicon wafer) that has a coefficient of thermal expansion (CTE) which is the same or similar to the semiconductor material of the IC chips 110 and 112. The trenches 102 and 104 are etched into the surface of the semiconductor substrate carrier 100 using a dry etch process (e.g., reactive ion etch (RIE). The trenches 102 and 104 are formed with depths D1 and D2, respectively. The semiconductor IC chips 110 and 112 have respective thicknesses T1 and T2. In some embodiments, it is assumed that the chip thicknesses T1 and T2 are different. While the trenches 102 and 104 are etched to have target areas and target depths that are substantially the same as the footprint areas and thicknesses T1 and T2 of the respective semiconductor IC chips 110 and 112 disposed in the trenches 102 and 104, the process variability in the trench patterning can result in variability of the depths D1 and D2 (e.g., 1 micron to 3 micron variability) such that the active surfaces of the semiconductor IC chips 110 and 112 are not coplanar with the surface of the semiconductor substrate carrier 100. As explained in further detail below, the insulating layer 120 is deposited over the active surfaces of the semiconductor IC chips 110 and 112 and the surface of the semiconductor substrate carrier 100 and then planarized to create a planar surface on which the wiring layer 130 can be built to form the requisite chip-to-chip interconnect wiring 140 and fan-out wiring 150 for power and input/output distribution.

In some embodiments, the chip-to-chip interconnect wiring 140 is disposed in a chip interconnection region of the wiring layer 130 to provide high density I/O signal communication between the adjacent semiconductor IC chips 110 and 112. In some embodiments for high-performance and high-density integrated package solutions, the conductive vias 122 are formed with interconnect pitches of, e.g., 50 microns or less, and the chip-to-chip interconnect wiring 140 is formed with line width and line spacing design rules of 10 microns or less. In some embodiments, the chip-to-chip interconnect wiring 140 is formed with sub-micron line-width and line-spacing design rules using BEOL fabrication techniques. In some embodiments, the array of contact pads 110-1 and 112-2 on the active surfaces of the semiconductor IC chips 110 and 112 are formed with a contact pitch of about 55 microns or less, depending on the application.

The array of contact pads 152 and the array of solder bumps 160 form a ball grid array (BGA) of contacts on a bottom side of the package structure 10. In some embodiments, the array of solder bumps 160 on the bottom side of the package structure 10 are formed with a contact pitch of about 75 microns or greater, or 150 microns or greater, depending on the application. For example, the flip-chip bumps 160 can be implemented using controlled collapse chip connection (C4) flip-chip bump technology where solder bumps are formed on ball limiting metallurgy (BLM) pads or under bump metallization (UBM) pads. The multi-chip package structure 10 can be mounted to another substrate such as ceramic substrate, a silicon substrate or an organic laminate build-up substrate, or any other type of substrate technology that is suitable for the target application.

Figure 2:
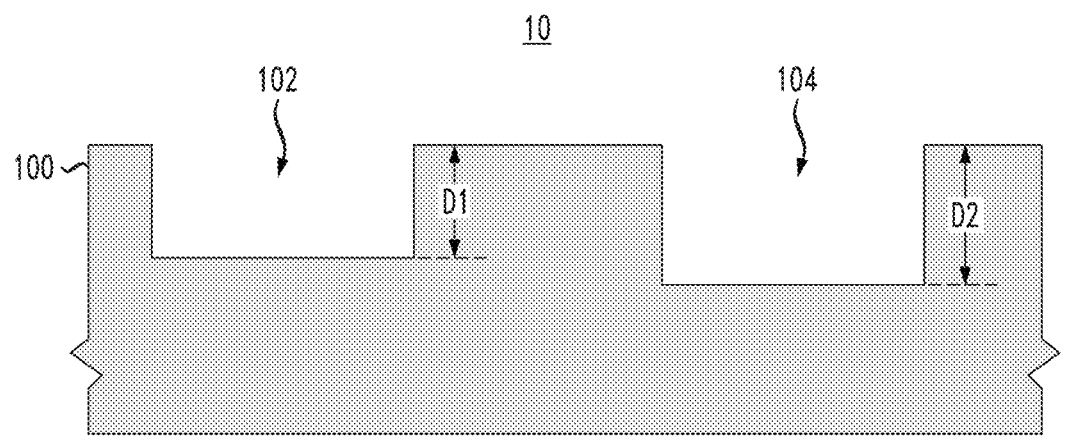

FIGS. 2-7 schematically illustrate a method for fabricating a multi-chip package structure according to an embodiment of the disclosure. In particular, for illustrative purposes, FIGS. 2-7 schematically illustrate a method for fabricating the multi-chip package structure 10 as shown in FIG. 1. To begin, FIG. 2 is a schematic cross-sectional side view of the multi-chip package structure 10 at an initial stage of fabrication comprising a semiconductor substrate carrier 100 having a plurality of trenches 102 and 104 etched in a surface of the semiconductor substrate carrier 100. In some embodiments, at this stage of fabrication, the semiconductor substrate carrier 100 comprises a semiconductor wafer that is patterned to form a set of trenches that are to house a set of cooperating semiconductor IC chips that are selected to form a system-in-package (SIP). In some embodiments, the semiconductor wafer is patterned to form a plurality of the same set of trenches to house the same set of cooperating semiconductor IC chips to a plurality of the same SIPs. In some embodiments, the semiconductor substrate carrier 100 comprises a silicon wafer, although the wafer may comprise other types of semiconductor wafer substrate materials that are commonly used in bulk semiconductor fabrication processes.

The plurality of trenches 102 and 104 are formed using standard photolithography and dry etching techniques. The parameters of the dry etch process can be selected to achieve target depths D1 and D2 of the trenches 102 and 104 which are matched to the different thicknesses of the semiconductor IC chips to be placed into the trenches 102 and 104. However, despite careful selection of the dry etch process parameters, some level of variability in the trench patterning process may be present due to, e.g., the different footprint sizes and different thicknesses of the semiconductor IC chips that are to be placed into the trenches 102 and 104. The trench patterning variability can result in differences of 1 micron or more between the target trench depths and the actual trench depths that are obtained over the area of the semiconductor wafer, thereby resulting in relatively poor trench depth uniformity.

In addition to the variability of the trench depth resulting from the trench patterning process, there can be variation in the thickness of the semiconductor IC chips that are obtained from the same or different chip suppliers/manufacturers. In particular, the manufacturer's specification for a given semiconductor IC chip may specify that the given chip has a nominal thickness, and the trenches for such semiconductor IC chip may be fabricated based on the manufacturer's nominal thickness specification. However, in practice, there can be a difference of up to 5 microns between the manufacturer's nominal thickness specification and the actual chip thickness. Therefore, when trenches are fabricated to match the manufacturer's thickness specification for a given type of semiconductor IC chip, there may be a difference between the depths of the etched trenches and the actual thickness of the given type of semiconductor IC chip.

Figure 3:
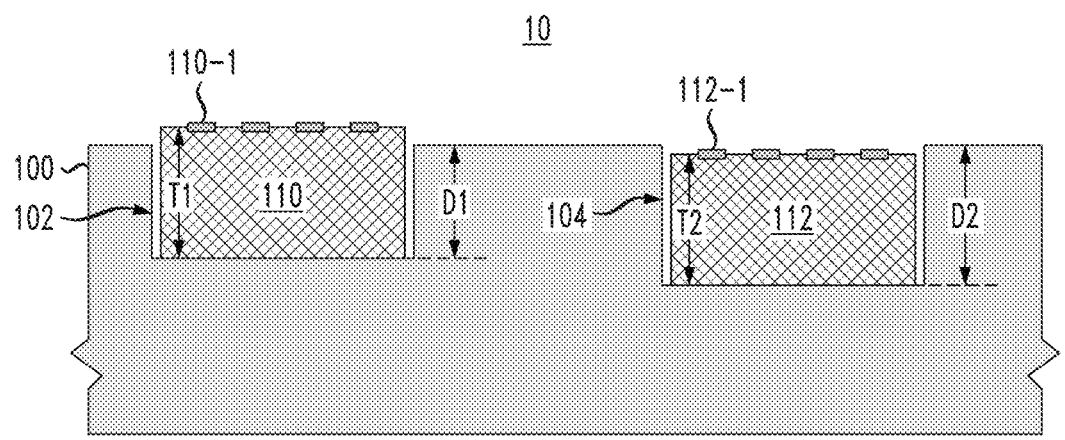

Next, FIG. 3 is a schematic cross-sectional side view of the intermediate multi-chip package structure 10 of FIG. 2 after placing the semiconductor IC chips 110 and 112 into the etched trenches 102 and 104 of the semiconductor substrate carrier 100. The semiconductor IC chips 110 and 112 are aligned and placed into the trenches 102 and 104 such that the active surfaces of the semiconductor IC chips 110 and 112 comprising the respective arrays of contact pads 110-1 and 112-1 are face up, and the non-active (backside) surfaces of the semiconductor IC chips 110 and 112 are disposed in contact with bottom surfaces of the trenches 102 and 104. The placement of the semiconductor IC chips 110 and 112 can be performed using a standard chip-to-wafer pick and place and bonder tool.

As schematically illustrated in the exemplary embodiment of FIG. 3, the trench depth variability and/or chip thickness variability results in the actual depth D1 of the trench 102 being less than the thickness T1 of the semiconductor IC chip 110 such that the active surface of the semiconductor IC chip 110 is disposed above the surface level of the semiconductor substrate carrier 100. As further shown in FIG. 3, the trench depth variability and/or the chip thickness variability results in the actual depth D2 of the trench 104 being greater than the thickness T2 of the semiconductor IC chip 112 such that the active surface of the semiconductor IC chip 112 is disposed below the surface level of the semiconductor substrate carrier 100.

Figure 4:
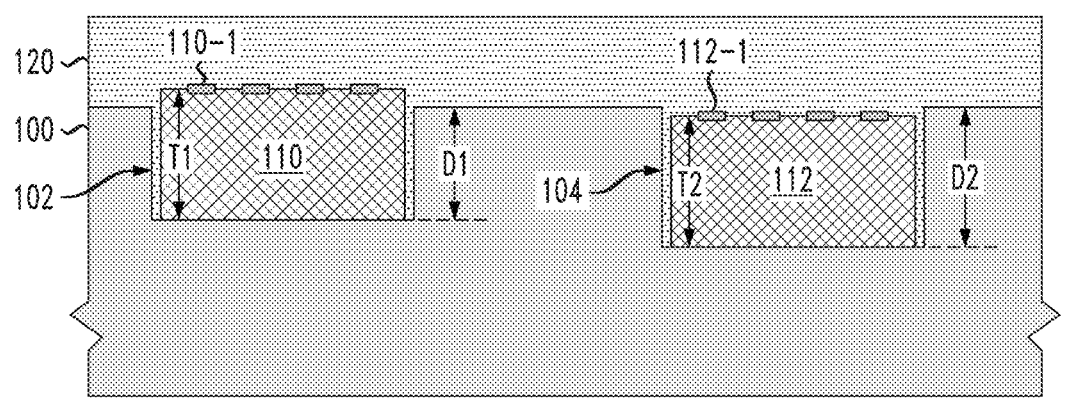

Next, FIG. 4 is a schematic cross-sectional side view of the intermediate multi-chip package structure 10 of FIG. 3 after depositing a layer of insulating material 120 over the surface of the semiconductor substrate carrier 100. In some embodiments, the layer of insulating material 120 comprises a silicon oxide material. For example, in some embodiments, the silicon oxide material comprises tetraethyl orthosilicate (TEOS) silicon dioxide which is deposited using known chemical vapor deposition (CVD) techniques. The TEOS silicon dioxide film can be formed with relatively low deposition temperatures and can be deposited with relatively high conformality. The layer of insulating material 120 serves various purposes.

For example, the layer of insulating material fills in the small gaps between the sidewalls of the semiconductor IC chips 110 and 112 and the sidewalls of the trenches 102 and 104 to thereby bond the semiconductor IC chips 110 and 112 to the semiconductor substrate carrier 100 and hold the semiconductor IC chips 110 and 112 in place in the etched trenches 102 and 104 of the semiconductor substrate carrier 100. Furthermore, the layer of insulating material 120 is utilized to form a planarized surface on which a BEOL structure can be formed. The layer of insulating material 120 is deposited with a thickness which is sufficient to cover the active surfaces of the semiconductor IC chips 110 and 112 and allow the layer of insulating material to be planarized to form a planarized surface which covers the semiconductor IC chips 110 and 112 and, thereby, effectively "planarize" the upper active surfaces of the semiconductor IC chips 110 and 112 to be effectively at the same level.

Figure 5:
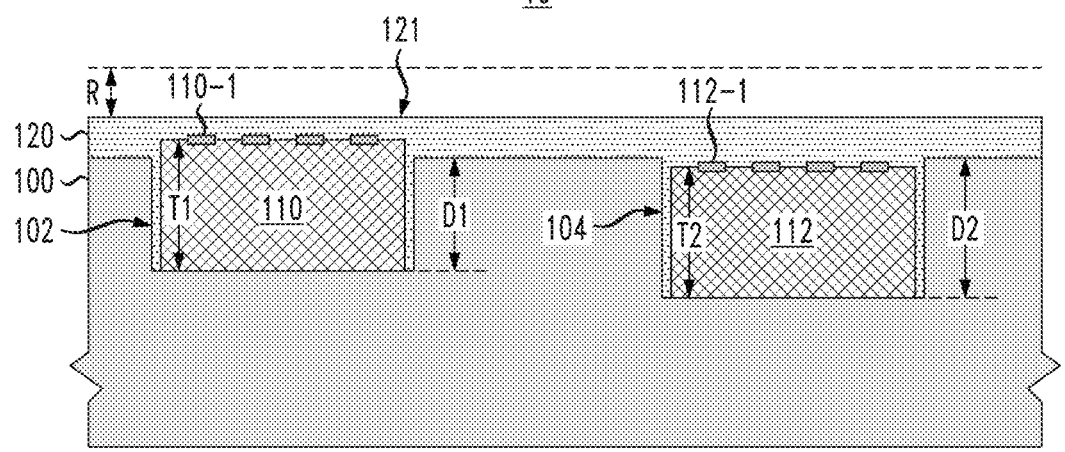

In particular, FIG. 5 is a schematic cross-sectional side view of the intermediate multi-chip package structure 10 of FIG. 4 after planarizing the layer of insulating material 120 to form a planarized surface 121. The planarization process can be performed using a physical mechanical polish process or chemical mechanical polish (CMP) process. In some embodiments, the layer of insulating material 120 is recessed down by a target amount R which is sufficient to form the planarized surface 121 while maintaining a sufficient thickness of the planarized insulating layer 120 above the upper active surfaces of all the semiconductor IC chips 110 and 112. In some embodiments, an etch stop mechanism is utilized to terminate the planarization process. In some embodiments, the etch stop mechanism comprises "zero-level" alignment marks that formed in or on the surface of the semiconductor substrate carrier 100 in various regions of the wafer. The alignment marks can be formed such that during the planarizing process, the layer of insulating material 120 is polished to a target level where, e.g., (i) the alignment marks can be seen through the insulating layer 120 or (ii) the alignment marks are reached. In other embodiments, the planarizing process can be performed down to a level which exposes the contact pads on the upper surface of the semiconductor IC chip (e.g., semiconductor IC chip 110) that is disposed at a highest level above the surface of the semiconductor substrate carrier 100.

Figure 6:
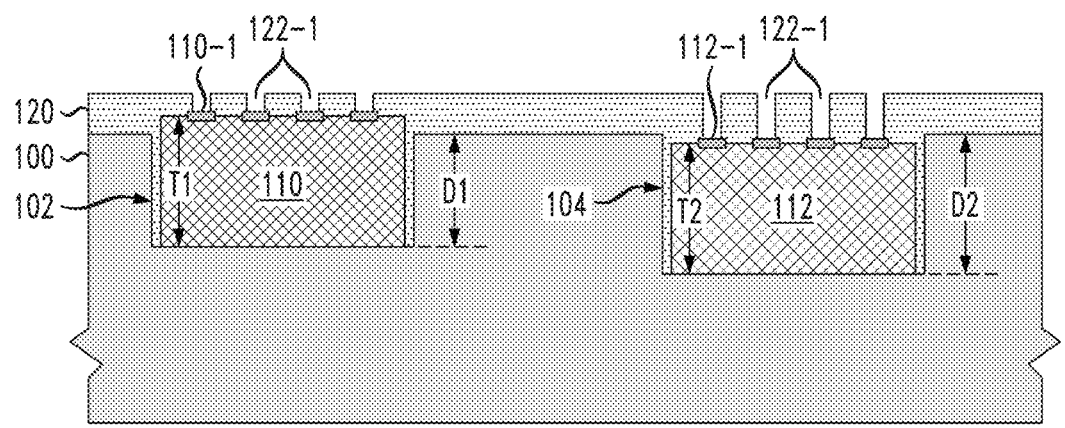

Following the planarization process to form the planarized surface 121, a BEOL process module is implemented to form interconnections between the semiconductor IC chips 110 and 112. For example, as an initial phase of the BEOL process module, FIG. 6 is a schematic cross-sectional side view of the intermediate multi-chip package structure 10 of FIG. 5 after patterning the planarized insulating layer 120 to form via openings 122-1 to expose the contact pads 110-1 and 112-1 on the active surfaces of the semiconductor IC chips 110 and 112. The via openings 122-1 are formed using photolithography and dry etch processes which are suitable for the given application.

Figure 7:
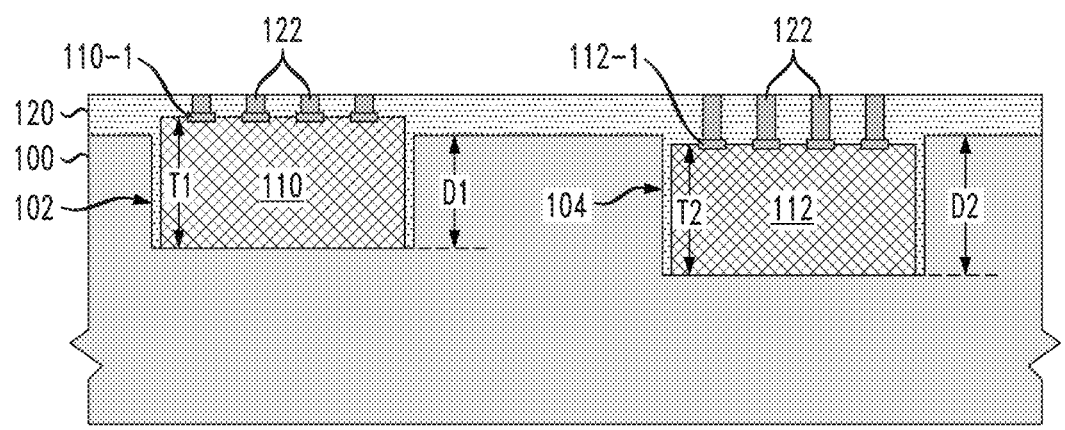

Next, FIG. 7 is a schematic cross-sectional side view of the intermediate multi-chip package structure 10 of FIG. 6 after filling the via openings 122-1 with metallic material to form vertical vias 122 on top of the contact pads 110-1 and 112-1. In some embodiments, the vertical vias are formed by depositing one or more conformal liner layers (e.g., diffusion barrier layer and/or seed layer) to line the inner walls of the via openings 122-1 and depositing a layer of metallic material, such as copper, to fill the via openings 122-1 with the metallic material. A planarization process (e.g., CMP) is then performed to remove the overburden liner and metallic material and planarize the surface of the semiconductor structure down to the surface 121 of the insulating layer 120 to thereby form the vertical vias 122 in the planarized insulating layer 120.

Following formation of the vertical vias 122, the BEOL process module continues to form the wiring layer 130 (FIG. 1) which comprises a stack of signal interconnect and redistribution layers comprising fine pitch lateral wiring and vertical inter-level vias. In particular, as noted above, the wiring layer 130 comprises a plurality of metallization layers comprising ILD layers 132 and metallic interconnect structures 140 and 150 comprising vertical vias (and associated via landing pads) and horizontal wiring embedded within the ILD layers 132. The ILD layers 132 can be formed using dielectric materials which are commonly used for BEOL fabrication, including, but not limited to, silicon oxide, hydrogenated silicon carbon oxide (SiCOH), SiCH, SiCNH, or other types of silicon based low-k dielectrics (e.g., k less than about 4.0), porous dielectrics, or known ULK (ultra-low-k) dielectric materials (with k less than about 2.5). The ILD layers 132 may be deposited using known deposition techniques, such as, for example, atomic layer deposition (ALD), chemical vapor deposition (CVD), plasma-enhanced CVD (PECVD), physical vapor deposition (PVD), or spin-on deposition.

The metallic interconnect structures 140 and 150 embedded within the ILD layers 132 collectively provide high-density die-to-die interconnections (e.g., wiring 140) between the semiconductor IC chips 110 and 112, as well as redistribution wiring (e.g., wiring 150) for connecting some of the contact pads 110-1 and 112-1 of the semiconductor IC chips 110 and 112 to the bottom side contact pads 152 of the wiring layer 130. The metallic interconnect structures 140 and 150 can be formed using metallic materials which are commonly used for BEOL fabrication, including, but not limited to, copper, cobalt, ruthenium, etc. For example, in some embodiments, the vertical vias and horizontal wiring that form the interconnect structures 140 and 150 are formed with copper using single and/or dual damascene metallization processes. In addition, depending on the dielectric and metallic materials used to form the ILD layers 132 and the metallic interconnects 140 and 150, thin diffusion barrier liners and seed layers can be deposited to line trenches formed in the ILD layers 132 prior to metal deposition, using known materials and deposition techniques.

A contact pad layer comprising the insulation layer 134 (e.g., passivation layer) and the contact pads 152 can be formed by depositing and patterning a layer of dielectric/insulating material (as the passivation layer 134) to form trenches, and depositing a layer of metallic material (e.g., copper) to fill the trenches with the metallic material to form the contact pads 152. A CMP process is then performed to remove the overburden metallic material and planarize the contact pad layer down to the surface of the insulation layer 134. The solder bumps 160 (e.g., solder balls) are then formed on the contact pads 152 using known methods to form flip-chip bump connections. For example, in some embodiments, the solder bumps 160 can be formed using a controlled collapse chip connection (C4) flip-chip bump technology where solder bumps are formed on ball limiting metallurgy (BLM) pads or under bump metallization (UBM) pads. In other embodiments, the solder bumps 160 can be formed by solder paste printing or electroplating. In another embodiment, the flip-chip bumps 160 can be plated bumps (e.g., nickel, copper, gold, tin plated bumps) that are formed on the contact pads 152 using electroless plating techniques.

Following the formation of the multi-chip package structure shown in FIG. 1, the wafer can be diced into individual fan-out multi-chip package structures to form a plurality of individual package structures shown in FIG. 1. In other embodiments, when the semiconductor IC chips 110 and 112 have through-silicon vias (TSVs) formed in the back sides of the chips, the backside of the semiconductor carrier substrate 100 can be grinded down to the back sides of the semiconductor IC chips 110 and 112 to expose the TSVs. In this instance, additional package structures (e.g., interposers, substrates, chips, etc.) can be connected to the TSVs exposed on the backsides of the semiconductor IC chips 110 and 112 to build various types of three-dimensional (3D) package structures, as is understood by one of ordinary skill in the art.

Figure 8:
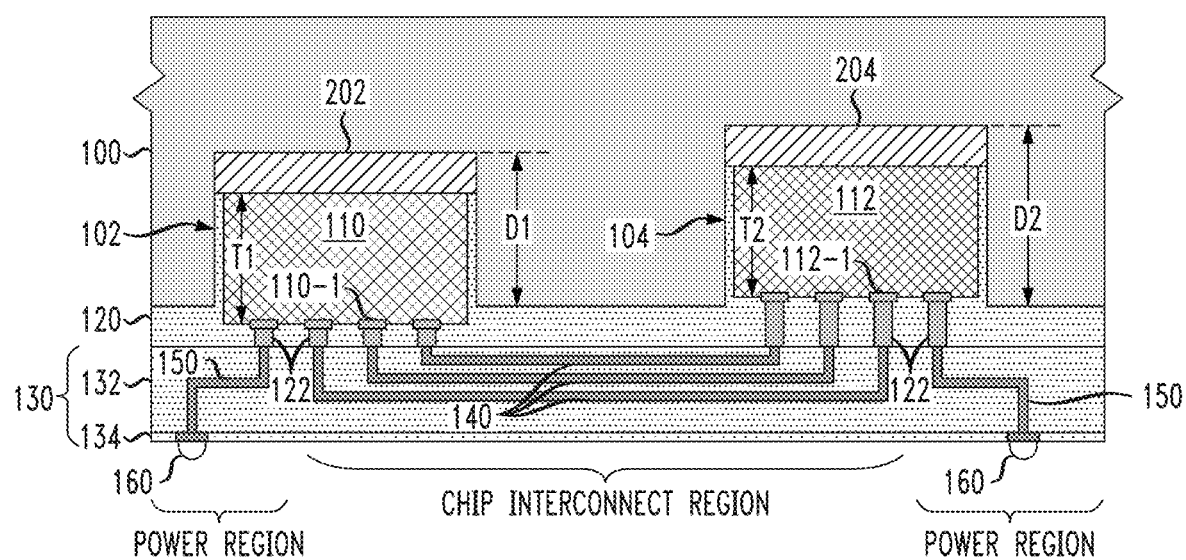
FIG. 8 schematically illustrates a multi-chip package structure according to another embodiment of the disclosure.

FIG. 8 schematically illustrates a multi-chip package structure 20 according to another embodiment of the disclosure. The multi-chip package structure 20 is similar to the multi-chip package structure 10 of FIG. 1, except that the multi-chip package structure 20 of FIG. 8 further comprises respective layers of thermal interface material (TIM) 202 and 204 disposed between the backsides of the semiconductor IC chips 110 and 112 and semiconductor substrate carrier 100. The TIM layers 202 and 204 may comprises any suitable material that can be used to enhance the thermal coupling and thermal conductivity between the semiconductor IC chips 110 and 112 and the semiconductor substrate carrier 100.

The TIM layers 202 and 204 serve various purposes. For example, the TIM layers 202 and 204 increase the heat dissipation/transfer rate from the heat-producing semiconductor IC chips 110 and 112 to the semiconductor substrate carrier 100 which serves as a heat-dissipating or heat spreading element. In addition, in embodiments where the TIM layers 202 and 204 are formed of a curable thermal adhesive, the TIM layers 202 and 204 serve as adhesive layers to bond the semiconductor IC chips 110 and 112 to the bottom surfaces of the etched trenches 102 and 104. Furthermore, the TIM layers 202 and 204 can be formed with target thickness which are sufficient to provide good thermal conductivity and to compensate for differences in the depth of the etched trenches and the thickness of the semiconductor IC chips. For example, as shown in FIG. 8, while the depth D2 of the trench 104 is greater than the thickness T2 of the semiconductor IC chip 112, the TIM layer 204 can be formed with a target thickness such that the active surface of the semiconductor IC chip 112 become coplanar or substantially coplanar with the surface of the semiconductor substrate carrier 100.

Figure 9:
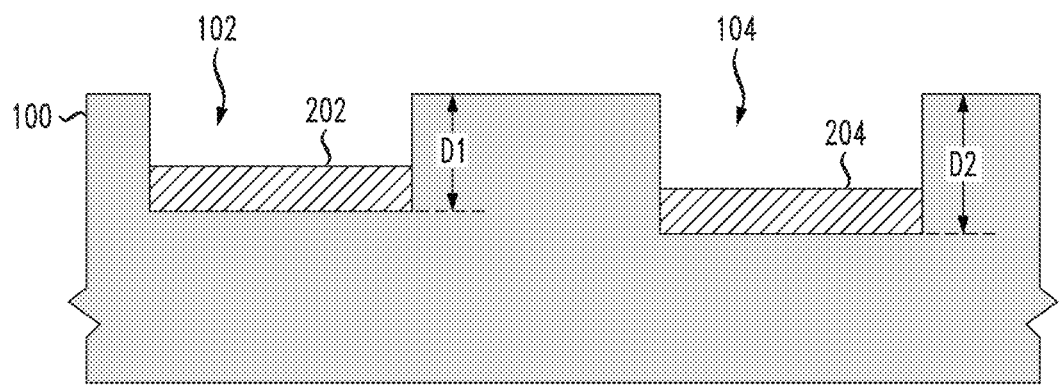
Figure 10:
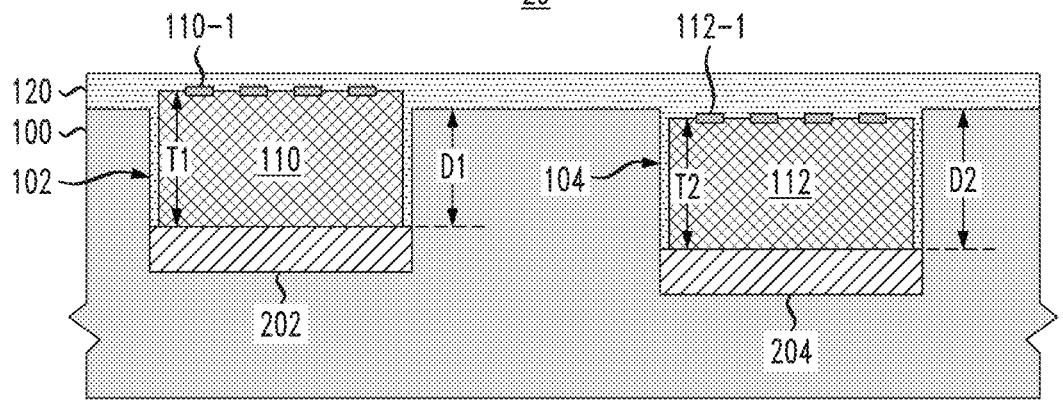

The multi-chip package structure 20 of FIG. 8 can be fabricated using the same or similar materials and process flow as discussed above in conjunction with FIGS. 1-7. For example, FIGS. 9 and 10 schematically illustrate a method for fabricating a multi-chip package structure according to another embodiment of the disclosure. In particular, for illustrative purposes, FIGS. 9-10 schematically illustrate an initial stage of a process flow for fabricating the multi-chip package structure 20 as shown in FIG. 8. To begin, starting with the intermediate structure shown in FIG. 2, FIG. 9 is a schematic cross-sectional side view of the intermediate multi-chip package structure 20 after forming the TIM layers 202 and 204 on bottom surfaces of the respective trenches 102 and 104 etched in the semiconductor substrate carrier 100. In some embodiments, the TIM layers 202 and 204 are formed by a process which comprises utilizing a suitable dispensing tool to dispense a target volume of TIM material (e.g., thermal adhesive) in liquid form in each of the trenches 102 and 104. The TIM material is then cured using known techniques to harden the TIM material and form the TIM layers 202 and 204.

Next, FIG. 10 is a schematic cross-sectional side view of the intermediate multi-chip package structure 20 of FIG. 9 after placing the semiconductor IC chips 110 and 112 into the etched trenches 102 and 104 of the semiconductor substrate carrier 100 and after depositing and planarizing a layer of insulation material to form the planarized insulating layer 120. The TIM material can be cured either before or after placing the semiconductor IC chips 110 and 112 into the etched trenches 102 and 104 of the semiconductor substrate carrier 100. Following the formation of the intermediate structure shown in FIG. 10, the same or similar process flow described above (e.g., FIGS. 6-7) is performed to form the via contacts 122 in the planarized insulation layer 120 and to form the wiring layer 130 on the planarized insulating layer 120, the details of which will not be repeated.

Figure 11:
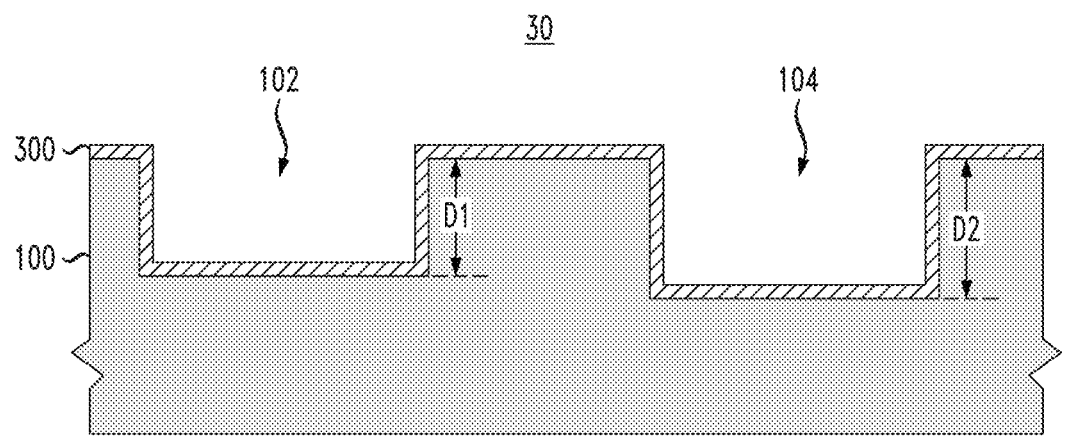
Figure 12:
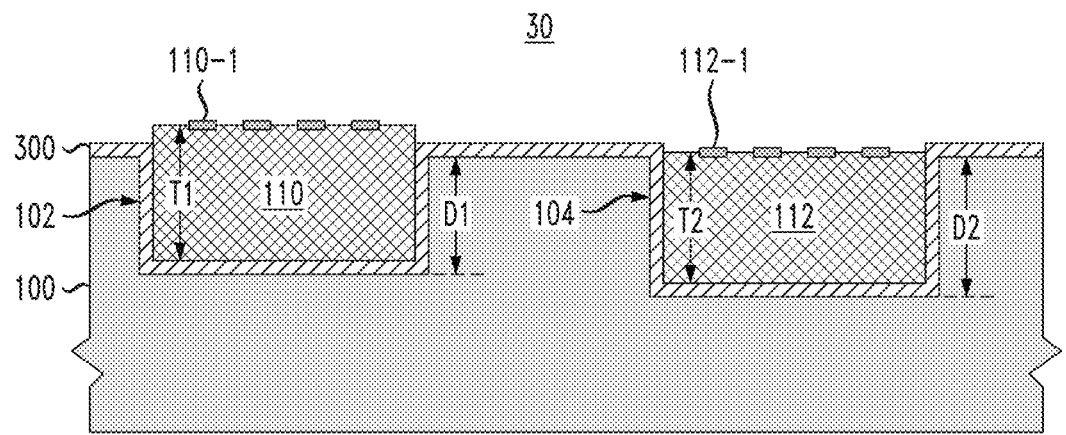

FIGS. 11 and 12 schematically illustrate a method for fabricating a multi-chip package structure 30 according to another embodiment of the disclosure. To begin, starting with the intermediate structure shown in FIG. 2, FIG. 11 is a schematic cross-sectional side view of the multi-chip package structure 30 after forming conformal bonding layer 300 which lines the bottom and sidewall surfaces of the trenches 102 and 104 etched in the semiconductor substrate carrier 100. In some embodiments, the conformal bonding layer 300 comprises a polymer material, an organic material, or an inorganic material (e.g., TiN) which serves to bond the semiconductor IC chips 110 and 112 to the surfaces of the trenches 102 and 104. For example, FIG. 12 is a schematic cross-sectional side view of the multi-chip package structure 30 of FIG. 11 after placing the semiconductor IC chips 110 and 112 into the etched trenches 102 and 104 of the semiconductor substrate carrier 100. In this embodiment, the portions of the conformal bonding layer 300 on the sidewall and bottom surfaces of the trenches 102 and 104 serve to bond the semiconductor IC chips 110 and 112 in place within the trenches 102 and 104. In other embodiments, the TIM layers 202 and 204 shown in FIG. 9 can be formed on the portions of the conformal bonding layer 300 on the bottoms of the trenches 102 and 104 before placement of the semiconductor IC chips 110 and 112 within the trenches 102 and 104. Following the formation of the intermediate structure shown in FIG. 12, the same or similar process flow described above (e.g., FIGS. 4-7) is performed to form the planarized insulation layer 120, to form the via contacts 122 in the planarized insulation layer 120, and to form the wiring layer 130 on the planarized insulating layer 120, the details of which will not be repeated.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

We claim:

1. A package structure, comprising:
   a semiconductor substrate carrier comprising a first trench and a second trench disposed in a surface of the semiconductor substrate carrier;
   a first semiconductor integrated circuit chip comprising a first array of contact pads disposed on an active surface of the first semiconductor integrated circuit chip, wherein the first semiconductor integrated circuit chip is disposed in the first trench with the active surface of the first semiconductor integrated circuit chip facing outward from the first trench;
a second semiconductor integrated circuit chip comprising a second array of contact pads disposed on an active surface of the second semiconductor integrated circuit chip, wherein the second semiconductor integrated circuit chip is disposed in the second trench with the active surface of the second semiconductor integrated circuit chip facing outward from the second trench;
wherein the active surface of at least one of the first and second semiconductor integrated circuit chips is non-coplanar with the surface of the semiconductor substrate carrier as a result of a difference between a trench depth and a chip thickness;
a planarized insulation layer disposed over the surface of the semiconductor substrate carrier and the active surfaces of the first and second integrated circuit chips;
an array of vertical vias disposed in the planarized insulation layer and in contact with the first and second arrays of contact pads of the first and second integrated circuit chips; and
a multi-layer interconnect structure disposed on the planarized insulating layer, wherein the multi-layer interconnect structure comprises wiring to provide chip-to-chip connections between the first and second integrated circuit chips, and wiring to provide package-to-chip connections which comprise power and ground connections to the first and second integrated circuit chips.

2. The package structure of claim 1, wherein the multi-layer interconnect structure comprise a back-end-of-the-line structure comprising multiple inter-layer dielectric layers with patterned metallization layers and vertical vias disposed in the inter-layer dielectric layers.

3. The package structure of claim 1, wherein the first and second arrays of contact pads comprise contacts that are disposed at a contact pitch of 75 microns or less.

4. The package structure of claim 1, wherein the planarized insulation layer is formed of a silicon oxide material.

5. The package structure of claim 4, wherein the silicon oxide material comprises tetraethyl orthosilicate silicon dioxide.

6. The package structure of claim 1, wherein the planarized insulation layer is configured to hold the first and second integrated circuit chips in place within the first and second trenches.

7. The package structure of claim 1, further comprising:
a first layer of thermal interface material disposed at a bottom of the first trench between a backside surface of the first integrated circuit chip and the semiconductor substrate carrier; and
a second layer of thermal interface material disposed at a bottom of the second trench between a backside surface of the second integrated circuit chip and the semiconductor substrate carrier.

8. The package structure of claim 7, wherein the first and second layers of thermal interface material comprise a thermal adhesive material which is configured to bond the first and second integrated circuit chips to bottom surfaces of the first and second trenches.

9. The package structure of claim 1, further comprising a conformal adhesive layer disposed on sidewalls and bottom surfaces of the first and second trenches, wherein the conformal adhesive layer is configured to bond the first and second integrated circuit chips within the first and second trenches.

10. The package structure of claim 9, wherein the conformal adhesive layer comprises a polymer adhesive material.

11. The package structure of claim 1, wherein the semiconductor substrate carrier comprises a silicon wafer.

12. The package structure of claim 1, wherein the first semiconductor integrated circuit chip comprises a processor chip, and wherein the second semiconductor integrated circuit chip comprises a memory chip.

13. The package structure of claim 1, wherein the active surfaces of the first and second integrated circuit chips are non-coplanar with the surface of the semiconductor substrate carrier.

14. A method for constructing a package structure, comprising:
forming a first trench and a second trench in a surface of a semiconductor substrate carrier;
placing a first semiconductor chip into the first trench, wherein the first semiconductor integrated circuit chip comprises a first array of contact pads disposed on an active surface of the first semiconductor integrated circuit chip, wherein the first semiconductor integrated circuit chip is placed in the first trench with the active surface of the first semiconductor integrated circuit chip facing outward from the first trench;
placing a second semiconductor integrated circuit chip into the second trench, wherein the second semiconductor integrated circuit chip comprises a second array of contact pads disposed on an active surface of the second semiconductor integrated circuit chip, wherein the second semiconductor integrated circuit chip is placed in the second trench with the active surface of the second semiconductor integrated circuit chip facing outward from the second trench;
wherein the active surface of at least one of the first and second semiconductor integrated circuit chips is non-coplanar with the surface of the semiconductor substrate carrier as a result of a difference between a trench depth and a chip thickness;
forming a planarized insulation layer over the surface of the semiconductor substrate carrier and the active surfaces of the first and second integrated circuit chips;
forming an array of vertical vias in the planarized insulation layer, wherein the vertical vias are formed in contact with the first and second arrays of contact pads of the first and second integrated circuit chips; and
forming a multi-layer interconnect structure over the planarized insulating layer, wherein the multi-layer interconnect structure comprises wiring to provide chip-to-chip connections between the first and second integrated circuit chips, and wiring to provide package-to-chip connections which comprise power and ground connections to the first and second integrated circuit chips.

15. The method of claim 14, wherein forming the planarized insulation layer comprises:
depositing a layer of insulating material to cover the surface of the semiconductor substrate carrier and the active surfaces of the first and second integrated circuit chips; and
planarizing the layer of insulation material down to a target recess depth to thereby form the planarized insulating layer.

16. The method of claim 15, wherein the layer of insulating material comprises tetraethyl orthosilicate silicon dioxide.

17. The method of claim 14, wherein forming the multi-layer interconnect structure comprises forming a back-end-of-line interconnect structure using a back-end-of-line process module, wherein the back-end-of-line structure comprising multiple inter-layer dielectric layers with patterned metallization layers and vertical vias disposed in the inter-layer dielectric layers.

18. The method of claim 14, further comprising:
forming a first layer of thermal interface material that is disposed between a backside surface of the first integrated circuit chip and a bottom surface of the first trench; and
forming a second layer of thermal interface material that is disposed between a backside surface of the second integrated circuit chip and a bottom surface of the second trench;
wherein the first and second layers of thermal interface material comprise a thermal adhesive material which is configured to bond the first and second integrated circuit chips to bottom surfaces of the first and second trenches.

19. The method of claim 14, further comprising depositing a conformal adhesive layer to line sidewalls and bottom surfaces of the first and second trenches prior to placing the first and second integrated circuit chips into the first and second trenches, wherein the conformal adhesive layer is configured to bond the first and second integrated circuit chips within the first and second trenches.

20. A method for constructing a package structure, comprising:
forming a first trench and a second trench in a surface of a silicon wafer;
placing a first semiconductor chip into the first trench, wherein the first semiconductor integrated circuit chip comprises a first array of contact pads disposed on an active surface of the first semiconductor integrated circuit chip, wherein the first semiconductor integrated circuit chip is placed in the first trench with the active surface of the first semiconductor integrated circuit chip facing outward from the first trench;
placing a second semiconductor integrated circuit chip into the second trench, wherein the second semiconductor integrated circuit chip comprises a second array of contact pads disposed on an active surface of the second semiconductor integrated circuit chip, wherein the second semiconductor integrated circuit chip is placed in the second trench with the active surface of the second semiconductor integrated circuit chip facing outward from the second trench;
wherein the active surface of at least one of the first and second semiconductor integrated circuit chips is non-coplanar with the surface of the silicon wafer as a result of a difference between a trench depth and a chip thickness;
forming a planarized insulation layer over the surface of the silicon wafer and the active surfaces of the first and second integrated circuit chips;
forming an array of vertical vias in the planarized insulation layer, wherein the vertical vias are formed in contact with the first and second arrays of contact pads of the first and second integrated circuit chips;
forming a multi-layer interconnect structure over the planarized insulating layer, wherein the multi-layer interconnect structure comprises wiring to provide chip-to-chip connections between the first and second integrated circuit chips, and wiring to provide package-to-chip connections which comprise power and ground connections to the first and second integrated circuit chips; and
dicing the silicon wafer to obtain at least one multi-chip package structure comprising the first and second integrated circuit chips.

\* \* \* \* \*